United States Patent [19]

Gobrecht et al.

[11] Patent Number: 4,801,554

[45] Date of Patent: Jan. 31, 1989

[54] PROCESS FOR MANUFACTURING A POWER SEMICONDUCTOR COMPONENT

[75] Inventors: Jens Gobrecht, Gebenstorf; Peter Roggwiller, Riedt-Neerach; Roland Sittig, Umiken; Jan Voboril, Nussbaumen, all of Switzerland

[73] Assignee: BBC Brown, Boveri & Company, Limited, Baden, Switzerland

[21] Appl. No.: 833,219

[22] Filed: Feb. 26, 1986

Related U.S. Application Data

[62] Division of Ser. No. 592,280, Mar. 22, 1984, Pat. No. 4,596,999.

[51] Int. Cl.$^4$ .......................................... H01L 21/308
[52] U.S. Cl. .......................................... 437/6; 437/245; 437/203; 437/228; 437/238; 437/165; 156/653
[58] Field of Search .................. 357/38 P, 38 C, 38 E, 357/22 E, 68; 29/580; 156/653; 437/6, 245, 203, 228, 238, 165, 194, 197, 198, 199

[56] References Cited

U.S. PATENT DOCUMENTS

| | | | |
|---|---|---|---|
| 3,609,476 | 9/1971 | Storm | 357/55 |
| 3,855,608 | 12/1984 | George et al. | 357/22 E |
| 3,999,281 | 12/1976 | Goronkin et al. | 29/580 |
| 4,243,999 | 1/1981 | Azuma et al. | 357/55 |
| 4,326,209 | 4/1982 | Nishizawa et al. | 357/22 E |
| 4,330,384 | 5/1982 | Okudaira et al. | 156/643 |
| 4,380,489 | 4/1983 | Beinvogl et al. | 156/643 |
| 4,417,385 | 11/1983 | Temple | 29/580 |
| 4,419,811 | 12/1983 | Rico | 29/580 |
| 4,466,176 | 8/1984 | Temple | 29/580 |
| 4,571,815 | 2/1986 | Baliga et al. | 29/580 |
| 4,587,712 | 5/1986 | Baliga | 357/22 E |
| 4,634,499 | 6/1987 | Gobrecht et al. | 156/643 |

FOREIGN PATENT DOCUMENTS 0000633  1/1979  Japan ................. 357/38 G

Primary Examiner—Brian E. Hearn
Assistant Examiner—Kevin McAndrews
Attorney, Agent, or Firm—Oblon, FIsher, Spivak, McClelland & Maier

[57] ABSTRACT

A process for manufacturing a power semiconductor component having a component of this type is presented which has at least three consecutive layers and possessing a high current capacity and small power losses. For contacting the first two layers, the component has first second metallized contact planes, which impress a step-like structure onto a first surface of the component. The steps have a height of between 10 and 20 μm and a width of between 20 and 300 μm. The ratio between the surface area of the first contact plane and the surface area of the second contact plane is between 1 and 4. The first layer is heavily doped and has a maximum thickness of 8 μm, and the second layer is lightly doped and has a maximum thickness of 40 μm. According to the process for manufacturing the component, the surface structure according to the invention is produced essentially by a reactive ion-etching process with a single aluminum mask.

2 Claims, 2 Drawing Sheets

PROCESS FOR MANUFACTURING A POWER SEMICONDUCTOR COMPONENT

This is a division of application Ser. No. 592,280, filed Mar. 22, 1984, now U.S. Pat. No. 4,596,999.

BACKGROUND OF THE INVENTION

1. Field of the Invention

This invention relates to a power semiconductor component having at least three layers, including first and second layers extending up to a first surface which has sectionalized contact planes resulting in a step-like structure for contacting the first and second layers, and to a process for its manufacture.

2. Description of the Prior Art

Such a component as noted above is known, for example, from German Offenlegungsschrift No. 2,719,219. The semiconductor device described therein has four layers in a pnpn arrangement. The n-doped cathode layer 8 is subdivided into several sections, in order to allow contacting in two planes (FIG. 1). It has a surface doping of $5 \times 10^{20}$ atoms cm$^3$ and is 10 $\mu$m thick. The p-base layer 6, located underneath, has a surface doping of $2 \times 10^{18}$ atoms/cm$^3$ and is 53 $\mu$m thick. The width of the cathode sections is at least 320 $\mu$m. The maximum reverse voltage of the pn junction between the cathode layer 8 and the p base 6 is 10 volt. The semiconductor device described is designed for a total current capacity of 400 A.

A process for manufacturing the abovementioned semiconductor device is also indicated (FIG. 6). For this purpose, boron or gallium is first diffused into both sides of an n-doped silicon substrate 42. The doping of the n substrate is about $10^{13}$–$10^{16}$ atoms/cm$^3$. The p layers which have been diffused in, the p base layer 46 and the anode 44 have a surface doping of about $2 \times 10^{18}$ atoms/cm$^3$. To form the cathode layer 48, phosphorus is diffused into the p base layer 46. This n layer 48 is photolithographically subdivided into several sections. Aluminium layers are then applied to the anode layer 44, to the cathode sections 48 and to the subdivided p base layers 46.

The known semiconductor device can be switched off by applying a negative current pulse to the p base layer 6 (gate). The power required for this purpose and supplied from the outside is considerable. The load current is constricted towards the middle of a cathode section by this current pulse and a part of the load current is thus drawn away to the gate. The current density of the remaining load current then becomes very high. If the switching-off step proceeds too slowly—for example in the case of unduly high switching-off amplification—or not homogeneously over the entire area of the semiconductor device, the latter is locally overloaded thermally and hence destroyed. The switching-off current via the gate produces a lateral voltage drop which should be smaller than the breakdown voltage of the pn junction between the cathode and the p base layer. However, the maximum reverse voltage of this pn junction is so low that an avalanche breakdown of this junction can occur during the switching-off step. The manufacturing process described is admittedly adequate for the structure having the dimensions of the known semiconductor device, but finer structures can hardly be produced satisfactorily this way.

German Offenlegungsschrift No. 2,855,546 describes a field-controlled thyristor which has characteristics similar to those of a p-i-n diode. This thyristor consists of a thin, heavily p-doped anode zone 15, a thick, lightly n-doped semiconductor substrate 11, several deep p-doped grid zones 12 and thin, heavily n-doped cathode zones 14 arranged in between (FIG. 3). The grid zones 12 consist of channels having a width of about 12 $\mu$m and a depth of 15 to 40 $\mu$m. To produce these grid zones 12, channels are etched into a <110>-oriented silicon substrate with a mixture of potassium hydroxide and isopropanol in a ratio of about 3:1 (FIG. 1). For this purpose, a mask 13 of silicon dioxide is first formed. The channels are then epitactically refilled with heavily p-doped silicon. A thin layer of poly-silicon then additionally forms on the silicon oxide layer which is removed by etching. A mask of silicon oxide is then formed for the cathode zones 14 which are produced by diffusion of phosphorus. Finally, the grid zones 12 and the cathode zones 14 are provided with metallizations, silicon dioxide being left in between for electrical insulation.

The silicon with <110>-orientation, required for the process described, cannot be drawn without dislocations. For this reason, the silicon wafers can be obtained only in an elliptical form and must be sand-blasted to give a round form for further processing. The base material for the component described is therefore much more expensive than that for conventional components.

SUMMARY OF THE INVENTION

It is therefore an object of this invention to achieve reliable switching-off in a semiconductor component of the abovementioned type, with small power loss and high current capacity.

Another object of this invention is to provide as simple as possible a process for the manufacture of semiconductor elements which have the finer surface nature according to the invention.

These and other objects are achieved according to the invention by providing a novel power semiconductor component including at least three consecutive layers of alternating conductivity, wherein the first layer is n-doped, the second layer is p-doped, and the third layer is n-doped. The first and second layers extend up to a first surface of the component, defined by a first contact plane and a second contact plane formed apart from each other. The first and second contact planes are divided into sections and define a step-like structure, and are provided for making connection to the first and second layers, respectively. The first layer has a maximum thickness of 8 $\mu$m and a doping of $5 \times 10^{18}$ to $5 \times 10^{20}$ atoms/cm$^3$ the second layer has a maximum thickness of 40 $\mu$m and a doping of $5 \times 10^{14}$ to $5 \times 10^{16}$ atoms/cm$^3$ the third layer has a doping of $5 \times 10^{14}$ to $5 \times 10^{16}$ atoms/cm$^3$, and the step-like structure is in the form of steps having a height of between 10 $\mu$m and 20 $\mu$m and a width of between 20 $\mu$m and 300 $\mu$m. The first and second contact planes have respective surface areas wherein the ratio between the surface area of the first contact plane and the surface area of the second contact plane is between 1 and 4.

According to another embodiment of the invention, there is provided a novel power semiconductor component including at least three consecutive layers of different doping concentration of conductivity, respectively, wherein the first and second layers are n-doped, and the third layer is p-doped. The component further includes a first contact plane and a second contact plane formed apart from each other to define a common surface, with the first and second contact planes divided into sections and defining a step-like structure, the first contact plane being provided for making connection to the first layer. A fourth, p-doped layer is provided between the second layer and the second contact plane, the second contact plane being provided for making connection to the fourth layer. The first layer has a maximum thickness of 8 μm and a doping of $5 \times 10^{18}$ to $5 \times 10^{20}$ atoms/cm$^3$, the second layer has a doping of $5 \times 10^{14}$ to $5 \times 10^{16}$ atoms/cm$^3$, and the step-like structure is in the form of steps having a height of between 10 μm. The first and second contact planes have respective surface areas wherein the ratio between the surface area of the first contact plane and the surface area of the second contact plane is between 1 and 4.

According to the invention, there is further provided a novel process for manufacturing the semiconductor component of the first above-noted embodiment, including producing the first layer as a heavily doped layer by diffusing impurities into the second layer, which is formed of a lightly doped semiconductor material; photolithographically forming a mask of an etch-resistant material on the first layer, which mask defines lateral dimensions of the step-like structure; etching trenches through the mask down into the second lightly doped layer by reactive ion etching; removing the mask; vapor depositing a thin metal layer over the entire surface including the first and second contact surfaces; and isotropically etching the surface having the thinned metal layer vapor deposited thereon until the thin metal layer has been completely removed on the side walls of the trenches, whereby the first and second contact surfaces are formed.

According to the invention there is also provided a novel process for manufacturing the semiconductor component of the second embodiment above-described, including producing the first layer as a heavily doped layer by diffusing impurities into the second layer, which is formed of lightly doped semiconductor material; applying a silicon dioxide layer to the first heavily doped layer; photolithographically forming a mask on the silicon dioxide layer, which mask defines lateral dimensions of the step-like structure; etching trenches down to the second lightly doped layer by reactive ion etching; removing the mask; producing a fourth layer which is heavily doped by diffusing impurities into the second layer through the trenches previously etched; completely removing the layer of silicon dioxide; vapor depositing a thin metal layer over the entire surface of the first, second and fourth layers; and isotropically etching the metal layer until the metal has been completely removed from the side walls of the trenches, wherein the first and second contact planes are formed by the remaining of the metal layer deposited on the first and fourth layers, respectively.

The power semiconductor component according to the invention has, inter alia, the advantage that it can always be reliably switched off even under large current loads at high switching frequencies. The light doping, according to the invention, of the second layer of the component ensures that the current is rapidly conducted away via the gate. As a result, switching-off delays are minimized and much more rapid switching-off properties are thus obtained. The manufacturing process according to the invention is particularly economical, since the surface structure is produced with a single mask.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
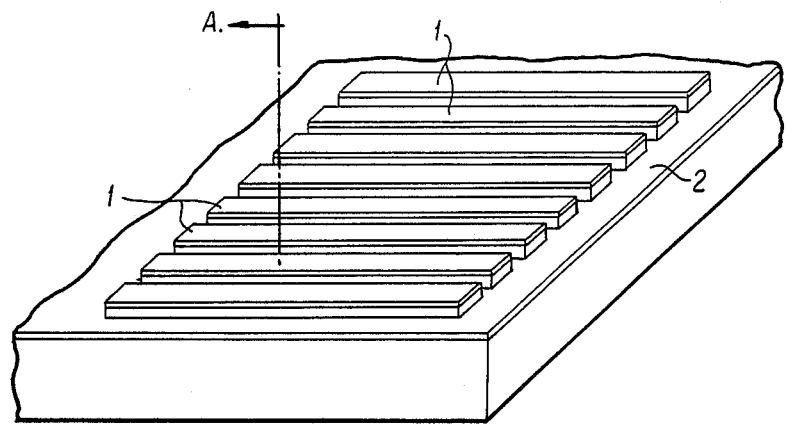
FIG. 1 is a perspective view of the surface structure of a component according to the invention.
Figure 2:
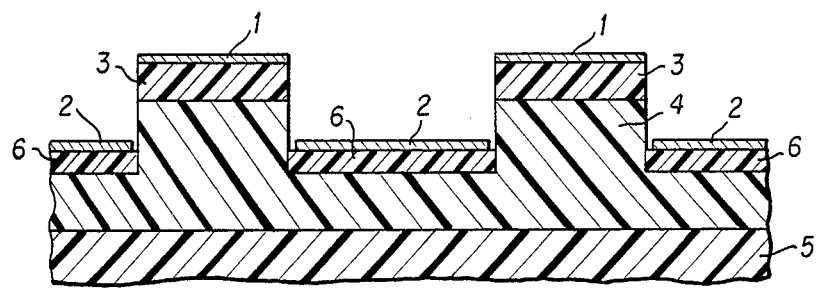
FIG. 2 is a cross-sectional view taken along the line A—A in FIG. 1.

Referring now to the drawings, wherein like reference numerals designate identical or corresponding parts throughout the several views, and more particularly to FIG. 1 thereof, a part of a power semiconductor component having a surface structure according to the invention is shown. On the heavily doped first semiconductor layer which consists of parallel step-like strips, there is a first metallic contact plane 1. A second metallized contact plane 2, located lower down, surrounds the parallel strips and serves for contacting the lightly doped second semiconductor layer. The precise layer sequence, at least as far as the upper part of the component is concerned, can be seen in FIG. 2. Below the first contact plane 1, there is a heavily doped first semiconductor layer 3 in the upper part of the strips. The adjoining lower part of the strips is formed by a lightly doped second layer 4 which extends underneath the second contact plane 2 across the entire component. At least one third layer 5 is also provided, adjoining the second layer 4. A heavily doped fourth layer 6 is located between the second contact plane 2 and the second layer 4. This layer is located to adjoin the second contact plane 2 and is laterally bounded by the second layer 4. In the manufacturing process, shown in FIG. 3, for a component according to the invention, the same reference symbols are used for the same elements as in FIGS. 1 and 2. To produce the precise structure of the surface of the component, a silicon dioxide layer 7 and an aluminum mask 8 are used.

Two components particularly suitable for the invention are now presented in detail.

The surface structure according to the invention and the light doping of the second layer have, first of all, proved themselves particularly with a thyristor which can be switched off via the gate. Such a thyristor has the conventional pnpn layer sequence and has been disclosed, for example, by German Offenlegungsschrift No. 2,719,219 (FIG. 1). With the layer sequence according to FIG. 2, this gives the following pattern:

the first layer 3, the cathode layer, has heavy n-doping of $5 \times 10^{18}$ to $5 \times 10^{20}$/cm$^3$, the second layer 4, the p base layer, has light p-doping of $5 \times 10^{14}$ to $5 \times 10^{16}$/cm$^3$, the third layer 5, the n base layer, has light n-doping of $5 \times 10^{14}$ to $5 \times 10^{16}$/cm$^3$, the fourth layer 6 has heavy p-doping of $5 \times 10^{18}$ to $5 \times 10^{20}$/cm$^3$, and a fifth layer (not shown), the anode layer adjoining the n base layer 5, has heavy p-doping of $5 \times 10^{17}$ to $5 \times 10^{19}$/cm$^3$.

A further metallized third contact plane (likewise not shown) is provided on the fifth layer. In order to obtain the correct dimensions of the step-like strips, the following considerations must be taken into account: During the switching-off step, the maximum shunt current to the second contact plane 2 is limited by the breakdown voltage across the pn junction between the cathode layer 3 and the p base layer 4. Assuming a homogeneous axial current flow $j_Z$ from the n base layer 5, the result for the maximum shunt current density is:

$$j_Q \simeq 4 \cdot 10^{-5} \cdot \mu_p \cdot \bar{N}_p^{\frac{1}{4}} \frac{W_p}{x_E^2} \left[ \frac{A}{cm^2} \right], \quad (1)$$

where $\mu_p$=mobility of the holes in the p base layer 4
$\bar{N}_p$=mean doping of the p base layer 4
$W_p$=thickness of the p base layer 4 underneath the first contact plane,
$x_E$=width of a step-like strip.

It follows from equation (1) that a reduction in the strip width $x_E$ and lighter doping $\bar{N}_p$ of the p base layer 4 do not restrict the shunt current $J_Q$ on switching-off. The maximum local current densities during the switching-off step decrease proportionally to the strip width $x_E$, which is tantamount to a homogeneous distribution of the power loss. Under the same assumption as in equation (1), the axial current density $j_Z$, as a function of the gate switch-off voltage $U_G$, can be estimated as follows:

$$j_Z (U_G) \simeq 4 \cdot N_p \cdot e \cdot \mu_p \cdot W_p \cdot \frac{U_G}{x_E^2} \quad (2)$$

where e=elementary charge.

For $N_p = 10^{15}$ cm$^{-3}$, $x_E$=50 $\mu$m and $W_p$=40 $\mu$m, the current density resulting on switching-off is then $$j_Z(U_G) \simeq 26 \cdot U_G [A/cm^2]$$

If the potential decreases linearly from the center of a strip towards the second contact plane 2, this means that, at a gate voltage $U_G$ of −40 V, the charge carriers already move approximately at the saturation velocity. This value of the gate voltage is substantially below the breakdown voltage of the pn junction between the cathode layer 3 and the p base layer 4.

To obtain an adequate potential separation between the two contact planes 1 and 2, a height of the step-like strips of at least 10 $\mu$m to 20 $\mu$m is required. The width of the strips is between 20 $\mu$m and 300 $\mu$m, and the ratio between the total surface area of the first contact plane 1 and the total surface area of the second contact plane 2 is between 1 and 4. This ensures that the power loss to be dissipated on switching-off is distributed sufficiently homogeneously across the component. Local heating of the component is therefore impossible, even in the event of peak voltages and peak currents which go far beyond the nominal values. Due to the combination of the very fine structure of the cathode layer 3 and the light doping of the p base layer 4, the depletion layer spreads underneath the entire width of the strip down to the depth of the second contact plane 2. As a result, the major part of the charges which are injected into the p base layer 4 during the on-state can be dissipated as a field current. Only a minor part of these charges is recombined. This leads to a substantial improvement in the switching speed of the component.

Secondly, the invention has been used with particular success in field-controlled thyristors. Such a component has been disclosed, for example, by German Offenlegungsschrift No. 2,855,546. This component consists of three semiconductor layers (FIG. 1 of the Offenlegungsschrift). For a component according to the invention, in accordance with FIG. 2, the layer structure is as follows:

the first semiconductor layer 3, the cathode layer, has heavy n doping of $5 \times 10^{18}$ to $5 \times 10^{20}$/cm$^3$,
the second semiconductor layer 4, the intrinsic layer, has light n doping of $5 \times 10^{14}$ to $5 \times 10^{16}$/cm$^3$, and
the third and fourth semiconductor layers 5 and 6, the anode layer and the gate zones, have heavy p doping of $5 \times 10^{18}$ to $5 \times 10^{20}$/cm$^3$.

In this component, a further, third metallized contact plane (not shown) is provided on the third semiconductor layer 5. The step height, step width and the ratio of the surface areas of the contact planes 1 and 2, according to the invention, must also be maintained in this component. The mode of action of the component is in principle the same as that described in German Offenlegungsschrift No. 2,855,546 (see pages 10 to 14 therein). Since the gate zones 6 of the component according to the invention are located at a lower level than the cathode layer 3, the load current during switching-off is constricted more rapidly by the depletion layers. Moreover, a higher load capacity of the component is ensured by the two contact planes 1 and 2. Another advantage of the invention is that the components according to the invention are much easier to produce, as is explained further below.

It is to be understood that the structure according to the invention is not limited to the strip form, even though this is most suitable in terms of production. A step-like surface structure can also be achieved by means of rings, sector-shaped structures or the like. Step height, step width and the ratio between the surface areas of the contact planes 1 and 2, according to the invention, should always be maintained in these cases.

The manufacturing process according to the invention is explained in more detail below by reference to FIG. 3, for a thyristor which can be switched off via the gate.

Figure 3A:
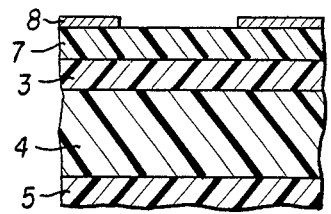
FIGS. 3a-3i are cross-sectional views illustrating the various steps of a manufacturing process according to the invention.
Figure 3F:
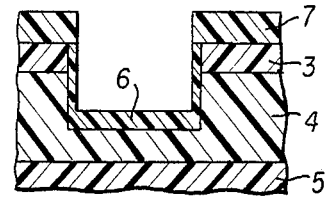
Figure 3B:
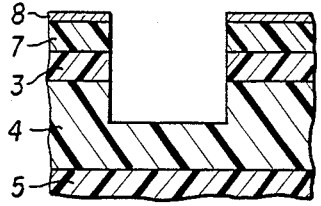
Figure 3G:
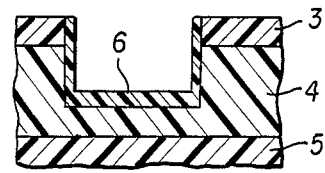
Figure 3C:
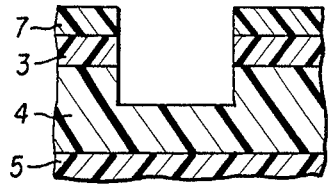
Figure 3H:
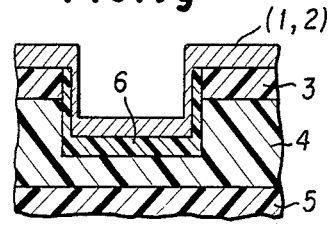
Figure 3D:
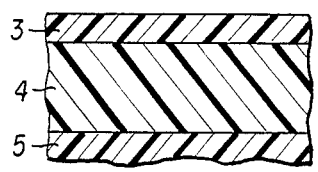

A silicon wafer is initially provided in the conventional manner with a pnpn layer sequence. For this purpose, the silicon wafer which has a base doping with n material of $2 \times 10^{13} - 2 \times 10^{14}$/cm$^3$ is first provided over the entire surface with a p layer, by applying an edge concentration of $3 \times 10^{15}$/cm$^3$ and diffusion with depths of penetration of 40 $\mu$m. By planar diffusion of phosphorus with a depth of penetration of about 3 to 5 $\mu$m, a cathode layer 3 is produced on the silicon wafer (FIG. 3a). Thereupon, a layer of silicon dioxide 7 is applied by oxidizing at 1300 to 1500 K. (FIG. 3b). An aluminum layer 8 of 2 $\mu$m thickness is vapor-deposited and, by means of a photolithographic process, a mask is formed from this (FIG. 3c). At the places where there is no aluminum mask 8, trenches of about 20 $\mu$m depth are etched by means of reactive ion etching (FIG. 3d). Such etching methods are known, for example, from J. Electrochem. Soc. Reviews and News, Volume 129, No. 3, pages 62C to 66C (March 1982). In this special case, SF$_6$ is used for the plasma, under a vacuum of 50 $\mu$bar. A voltage of 150 to 200 volt then establishes itself at the silicon wafer. The high frequency is 13.56 MHz and the Hf power density is, for example, 0.6 watt/cm$^2$. In this way, an etching rate of 100 to 500 $\mu$m/minute is obtained. The etching process itself is strongly anisotropic, that is to say predominant in the direction of the electric field, so that very sharp contours are obtained.

Figure 3I:
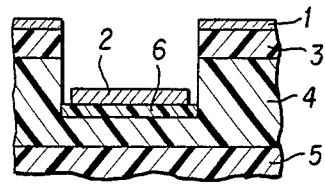
Figure 3E:
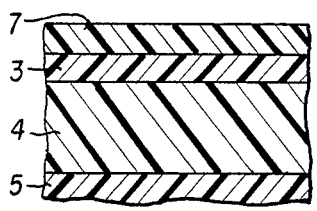

The aluminum mask 8 is then completely removed at a temperature of about 350 K. and an etching period of about 1 to 2 minutes (FIG. 3e). One liter of the etchant used for this purpose consists of 720 ml of H$_3$PO$_4$ (85% by volume pure H$_3$PO$_4$, 15% by volume water), 144 ml of H$_2$O and 36 ml of HNO$_3$ (65% by volume pure HNO$_3$, 35% by volume water). The trenches are then coated by brief boron diffusion with a thin (about 1 to 2 $\mu$m), heavily doped p layer 6 (FIG. 3f). Since the diffusion takes place above all in the axial direction, the coating of the trench walls is much less than in the trenches themselves. After this diffusion, the silicon dioxide layer 7 is removed by wet-chemical methods (for example with HF) at a temperature of 360 K. and an etching period of about one minute (FIG. 3g). A thin aluminum layer 1, 2 is vapour-deposited above the component surface thus structured (FIG. 3h). Since this process likewise proceeds above all axially, the edge coating is likewise very small. The aluminum layer 1, 2 and the heavily doped p layer 6 are then isotropically etched away by wet-chemical methods or by means of plasma, until the layers on the walls have been completely removed. The coating on the surfaces of the contact planes 1 and 2 is then still more than adequate (FIG. 3i). For this purpose, an etchant HNO$_3$ (65% by volume pure HNO$_3$, 35% by volume water) and HF (49% by volume pure HF, 51% by volume water) in a ratio of 10:1 is used. As a check, the reverse voltage characteristic between the contact planes 1 and 2 is determined, and this should correspond to that of a diode.

Although the manufacturing process described is the most advantageous, there are of course other possibilities for the individual process steps. For example, in the last step, the aluminum layer 1, 2 can be etched first isotropically by means of a selective etchant, and the p layer 6 can be etched only then by the method indicated. A check for edge coatings still present is made as above.

Obviously, numerous additional modifications and variations of the present invention are possible in light of the above teachings. It is therefore to be understood that within the scope of the appended claims, the invention may be practiced otherwise than as specifically described herein.

We claim:

1. A process for manufacturing a semiconductor component having at least first, second and third consecutive layers, the first and second layers extending up to a first surface of the component, the first layer being heavily doped, a first contact plane and a second contact plane formed apart from each other to define said first surface, said first and second contact planes divided into sections defining a steplike structure for making connection to the first layer and the second layer, wherein the first layer has a maximum thickness of 8 $\mu$m, the second layer, respectively, is lightly doped and has a maximum thickness of 40 $\mu$m, the step-like structure is in the form of steps having a height of between 10 $\mu$m, and 20 $\mu$m and a width of between 20 $\mu$m and 300 $\mu$m, and the first and second contact planes have respective surface areas, wherein the ratio between the surface area of the first contact plane is between 1 and 4, comprising:
   producing said first layer as a heavily doped layer by diffusing impurities into said second layer, which is formed of lightly doped semiconductor material;
   applying a silicon dioxide layer to said first heavily doped layer;
   photolithographically forming an aluminum mask on said silicon dioxide layer, said mask defining lateral dimensions of said step-like structure;
   etching trenches down to the second lightly doped layer by reactive ion etching of exposed portions of said silicon dioxide layer and said first layer not covered by said mask;
   removing said mask and thereby leaving portions of said silicon dioxide layer previously covered by said mask as a self-aligned diffusion mask with respect to said trenches;
   producing a fourth layer which is heavily doped by diffusing impurities into said second layer through the trenches previously etched while using the remaining portions of the self-aligned silicon dioxide layer as said diffusion mask;
   completely removing said layer of silicon dioxide;
   vapor depositing a thin metal layer over the entire surface of said first, second and fourth layers; and
   isotropically etching the said metal layer until the metal has been completely removed from the side walls of the trenches, wherein said first and second contact planes are formed by the remaining of said metal layer deposited on said first and fourth layers, respectively.

2. A process according to claim 1 wherein said reactive ion etching is performed in an SF$_6$ plasma.

* * * * *

UNITED STATES PATENT AND TRADEMARK OFFICE
CERTIFICATE OF CORRECTION

PATENT NO. : 4,801,554
DATED : Jan. 31, 1989
INVENTOR(S) : Jens GOBRECHT, et al.

It is certified that error appears in the above-identified patent and that said Letters Patent is hereby corrected as shown below:

The following entry should be listed on the Title page:

--[30]   Foreign Application Priority Data

Mar. 31, 1983   [CH]   Switzerland.............. 1793/83-4--

Signed and Sealed this

Eighth Day of August, 1989

Attest:

DONALD J. QUIGG

Attesting Officer

Commissioner of Patents and Trademarks